United States Patent [19]
Naedel et al.

[11] Patent Number: 5,309,315
[45] Date of Patent: May 3, 1994

[54] SEVERE ENVIRONMENT ENCLOSURE WITH THERMAL HEAT SINK AND EMI PROTECTION

[75] Inventors: Richard G. Naedel, Rockville; Francis J. Bogdan, Baltimore; Michael Richardson, Annapolis; Keith Rosenberger, Baltimore, all of Md.

[73] Assignee: Pulse Embedded Computer Systems, Inc., Greenbelt, Md.

[21] Appl. No.: 743,509

[22] Filed: Aug. 9, 1991

[51] Int. Cl.⁵ .......................... H05K 7/20; H05K 9/00
[52] U.S. Cl. ................................ 361/704; 174/35 R; 174/35 GC; 174/35 MS; 361/753; 361/818; 361/687
[58] Field of Search .................. 361/386, 388-389, 361/392-395, 399, 424, 415; 364/708; 174/35 MJ, 35 GC, 34 R

[56] References Cited

U.S. PATENT DOCUMENTS

| | | |
|---|---|---|
| 3,264,525 | 8/1966 | Swengel et al. ............... 361/394 |
| 3,316,460 | 4/1967 | Scoville ........................ 361/424 |
| 3,364,395 | 1/1968 | Donofrio et al. ............... 361/394 |
| 3,489,207 | 1/1970 | Miller .......................... 361/382 |
| 3,614,541 | 10/1971 | Farrand ....................... 361/394 |
| 3,925,710 | 12/1975 | Ebert .......................... 361/383 |
| 4,656,559 | 4/1987 | Fathi ........................... 361/394 |
| 4,953,058 | 8/1990 | Harris .......................... 361/383 |
| 4,963,414 | 10/1990 | LeVasseur et al. ............ 361/397 |
| 5,045,635 | 9/1991 | Kaplo et al. .................. 174/35 R |

FOREIGN PATENT DOCUMENTS

| | | |
|---|---|---|
| 0037574 | 10/1981 | European Pat. Off. ......... 174/35 R |
| 2229173 | 1/1974 | Japan .......................... 361/380 |
| 8504847 | 11/1985 | PCT Int'l Appl. ............. 361/380 |

Primary Examiner—Gregory D. Thompson
Attorney, Agent, or Firm—Nixon & Vanderhye

[57] ABSTRACT

A computer chassis construction for severe environmental conditions enclosing a plurality of circuit cards and a power supply includes a top cover, bottom cover, a pair of side plates and a pair of end plates secured together to form an airtight seal along all abutting edges. A backplane is fixed adjacent the bottom cover mounts a plurality of connectors for electrical connection with mating connectors along a first edge of each of a plurality of circuit cards. Mounting grooves for receiving second, third and fourth edges of each of the plurality of circuit cards are provided to rigidify the assembly. An internal partition separates the plurality of circuit cards from the power supply and the latter is also rigidly secured within the chassis. Integral cooling is provided for both the circuit cards and power supply.

36 Claims, 12 Drawing Sheets

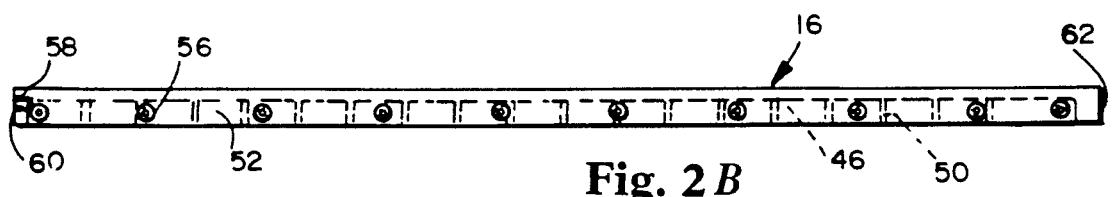
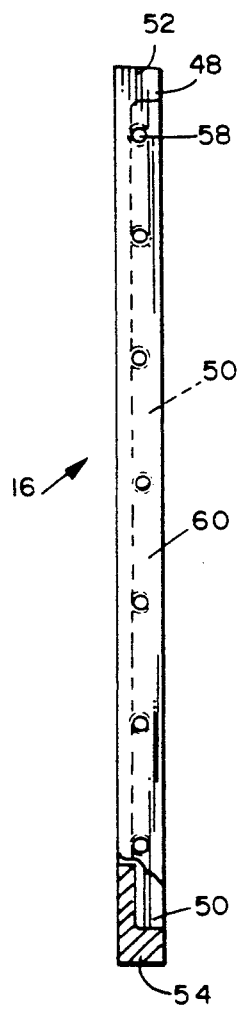
Fig. 2A

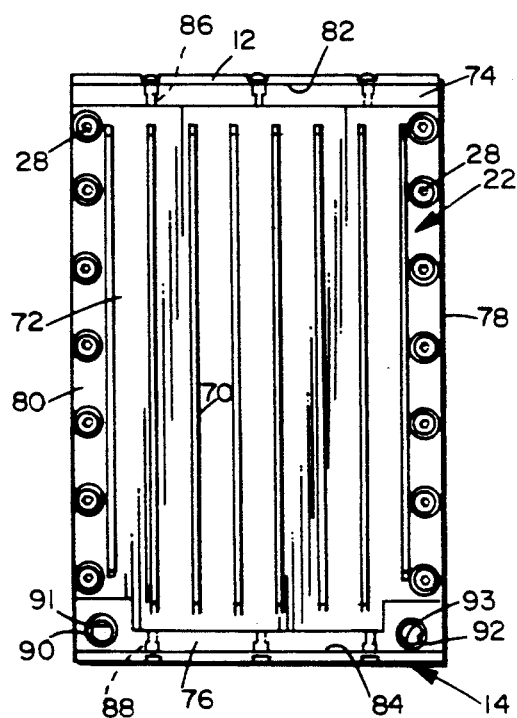
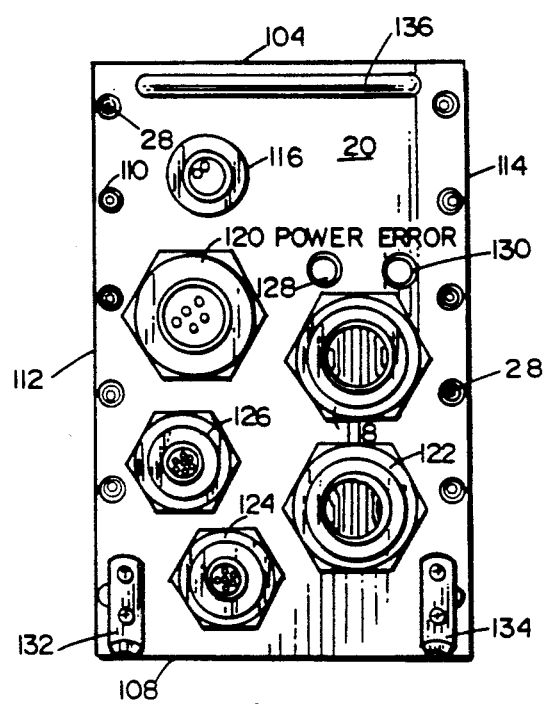
Fig. 3
Fig. 4

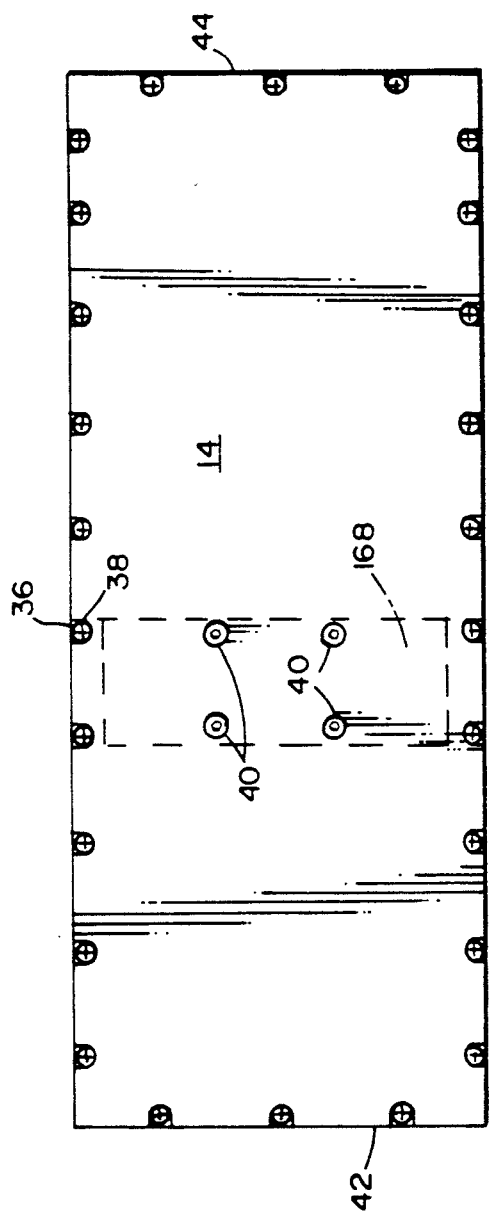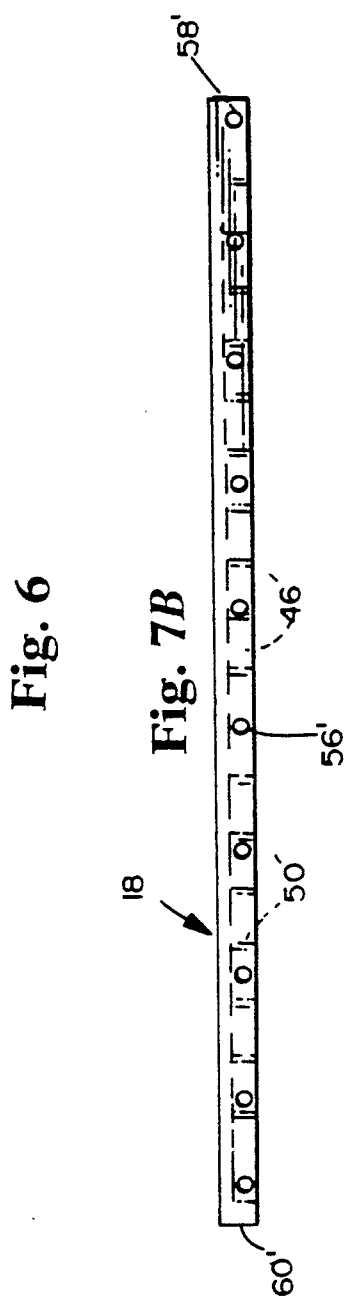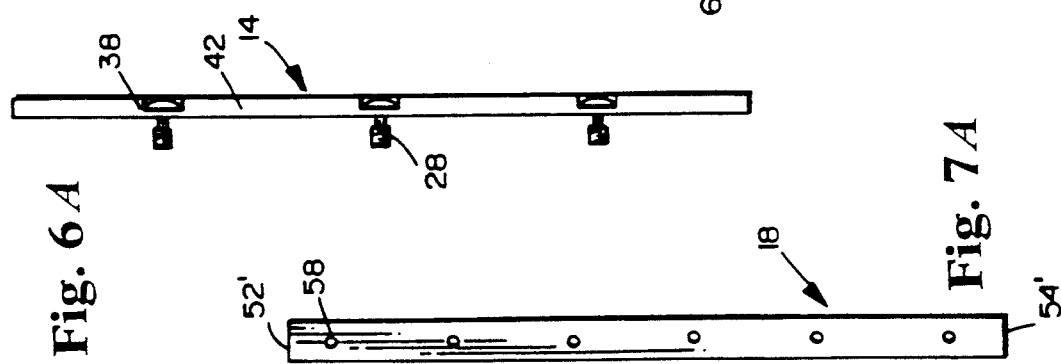

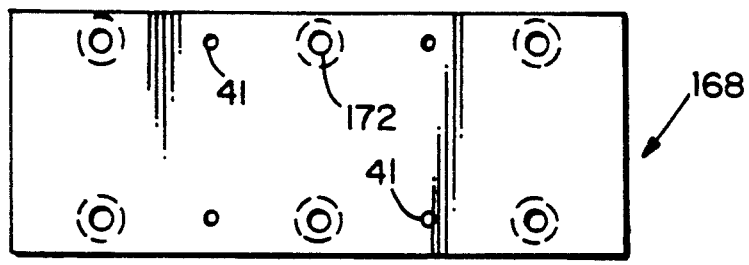
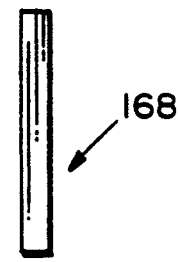
Fig. 10  Fig. 10A
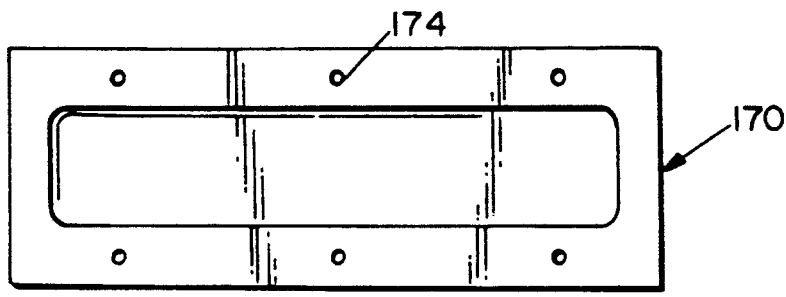
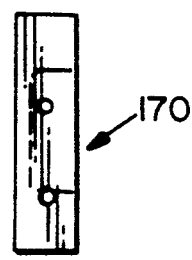
Fig. 11  Fig. 11A
Fig. 14
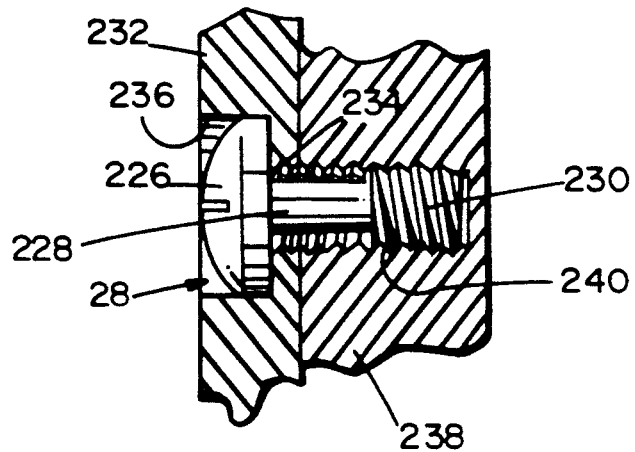

SEVERE ENVIRONMENT ENCLOSURE WITH THERMAL HEAT SINK AND EMI PROTECTION

This invention relates to a chassis construction for computer systems and, more specifically, to a specialized chassis construction designed to house and power circuit cards for a computer system used in very severe environments.

BACKGROUND AND SUMMARY OF THE INVENTION

With the ever increasing utilization of computers and computer systems for seemingly unending applications in various technological fields, it has become increasingly important to provide chassis or housings for computer components which will withstand severe environmental conditions. The problem has been long recognized in the aircraft industry, for example, and is becoming increasingly important with respect to other vehicular applications, particularly land vehicles. Generally speaking, environmental conditions will be most severe for military vehicles such as tanks, armored personnel carriers and the like which are required to perform under widely diverse climatic conditions but also severe operational conditions, i.e., conditions attendant to the specialized function of the vehicles. For computer and other electronic components, it is critical that such components be constructed, supported and enclosed in such a way as to be able to withstand such conditions including maximum extremes of shock, vibration, temperature, EMI, humidity, fungus as well as sand/dust, etc.

It is the principal object of the present invention to provide a versatile, compact, lightweight VME bus system which is low in cost, compact, versatile and lightweight, but which also meets the most rigorous environmental and electromagnetic military standards. Significantly, no external shock or vibration isolation is required by reason of the highly rigid nature of the construction. The present invention also incorporates modular construction, ease of repair and low maintenance.

Thus, in one exemplary embodiment of the invention, a computer chassis construction is provided which has a basic box-like configuration including aluminum alloy top and bottom walls or covers, a pair of side walls or plates and a pair of end plates rigidly fastened together as a rectangular enclosure.

A conventional backplane is rigidly mounted within the enclosure, adjacent the bottom cover. The backplane is provided with a plurality of connectors for supporting a plurality of thin, commercially available circuit cards (five in a preferred embodiment) in substantially parallel, upright relationship. The backplane also supports the power supply which is located behind one of the end plates, referred to herein as the face plate which is at the "front" of the enclosure. The other end plate is at the "rear" of the enclosure. As a result, the enclosure is divided into a circuit supporting area and a power supply supporting area by means of an interior partition rigidly mounted between the side plates and extending generally between the top and bottom of the enclosure.

The interior partition, also constructed of aluminum alloy material, has a first plurality of parallel, elongated grooves machined therein so as to extend substantially parallel to the side plates of the enclosure.

A similarly configured second plurality of grooves are machined in the interior surface of the end plate opposite the face plate, such that the first and second sets of grooves face each other within the circuit card supporting area of the enclosure.

The first and second sets of grooves (five in each set in accordance with the preferred embodiment) are designed to receive opposite parallel edges (referred to here as second and third edges) of the circuit cards mounted on the backplane, (the edge of each card electrically connected along the backplane will be referred to herein as the first edge). In order to rigidify the cards within the opposed grooves, commercially available, expandable locking bars, sold under the name Wedge-Lok TM (Series 40-5 or 40-5P), manufactured by EG&G Birtcher Co. of El Monte, California, are utilized, one along each of the second and third edges of each card. The locking fins rigidly clamp the second and third edges of the cards against adjacent groove sidewalls.

A card comb is rigidly secured to the interior surface of the top cover, and extends transversely of the top cover, between the forward and rearward ends thereof. The card comb is provided with a plurality (five in the preferred embodiment) slots, designed to receive portions of the fourth or top edges (opposite the first edges) of the circuit cards.

Upon assembly of the top cover to the end and side plates of the enclosure, the circuit cards will be rigidly and immovably secured within the circuit card supporting area of the enclosure.

Further rigidity and stiffening of the backplane (and card assembly) is achieved by transverse bars sandwiching the backplane and extending between the enclosure side plates, between the face plate and rear end plate. These bars are fastened to each other through the backplane, to the side plates, and to the bottom cover.

In the power supply supporting area of the enclosure, the power supply box is secured to the backplane via a voltage and I/O connector and to the interior partition separating the circuit supporting area from the power supply supporting area. The power supply is also operatively connected to the face plate which incorporates the various power, I/O connectors, indicators, etc. for the power supply.

It is another feature of this invention that no moving parts are required and, more particularly, no active cooling scheme is necessary. The circuit cards are in heat conducting relationship with the enclosure (rear) end plate which is provided on its exterior surface with a plurality of cooling fins, and to the interior partition which, in turn, is in heat conducting relationship with the enclosure side plates. The latter are also provided with cooling fins on their exterior surfaces.

In a similar manner, the power supply is in heat conducting relationship with the interior partition.

It is another feature of this invention that EMI protection is facilitated and enhanced by plating the surfaces of the side and end plates with thin layers of copper, nickel and tin, in that order.

It is still another feature of the invention that captive fasteners are employed to secure the top and bottom covers, side plates and end plates as described further herein, thereby minimizing the potential for losing the fasteners in the field during repair/replacement procedures.

The above described chassis construction thus incorporates the following features:

(1) the chassis is designed to house and power circuit cards for computer systems used in very severe environments, i.e., pre-specified maximum extremes of shock, vibration, temperature, EMI, humidity, fungus, as well as sand/dust environments;

(2) the chassis construction provides for the dissipation of circuit card heat by internal conduction, external convection and radiation from cooling fins;

(3) the chassis envelope meets the 1 1/2 1/2 ATR (Air Transport Rack) form factor (ARINC 404A Standard);

(4) the power supply is completely enclosed within and heat sink provided by the chassis;

(5) the chassis face plate provides an easy means to access and perform maintenance on the power supply and associated cabling and connectors;

(6) the chassis walls are processed with a multi-layer metal plating for enhanced EMI protection;

(7) the chassis top and bottom plates employ a specific type of captive fastener and fastener spacing to insure EMI integrity;

(8) the chassis design provides the internal means to insure rigid internal mounting of the power supply, backplane and circuit card assemblies;

(9) a card edge comb integral to the top plate is provided for insuring immobilization of the circuit card assemblies;

(10) the overall chassis construction design provides extreme stiffness of structure and immobilization of internal components to enhance the system's immunity to vibration. As a result, the system can be "hard mounted" directly in a land, sea or airborne platform without the need for shock mounting or external vibration isolation;

(11) the chassis has been tested and certified to the environmental specifications and testing procedures which are defined in MIL-STD-810D; and

(12) the chassis has been tested and certified to EMI immunity specifications which are defined in MIL Standard-461.

Other objects and advantages of the present invention will become apparent from the detailed description which follows.

BRIEF DESCRIPTION OF THE DRAWINGS

FIG. 2A is an end view, partially in section, of the left side plate of the chassis;

FIG. 2B is a top view of the left side plate as shown in FIGS. 1 and 2;

FIG. 3 is a rear end view of the chassis construction illustrated in FIG. 1;

FIG. 4 is a front end view of the chassis construction illustrated in FIG. 1;

FIG. 6 is a bottom plan view of the bottom cover of the chassis construction illustrated in FIG. 1;

FIG. 6A is an end view of the bottom cover illustrated in FIG. 6;

FIG. 7A is an end view of the side plate illustrated in FIG. 7;

FIG. 7B is a top view of the side plate illustrated in FIG. 7;

FIG. 10 is a top plan view of a shim inserted between the backplane and the bottom cover in accordance with an exemplary embodiment of the invention;

FIG. 10A is an end view of the shim illustrated in FIG. 11;

FIG. 11 is a bottom plan view of a center support bar mounted to the backplane above the shim shown in FIG. 11 and which is shown in plan in FIG. 8;

FIG. 11A is an end view of the center support bar illustrated in FIG. 12;

FIG. 14 is a section view illustrating a captive fastener in accordance with an exemplary embodiment of the invention.

DETAILED DESCRIPTION OF THE DRAWINGS

Figure 1:
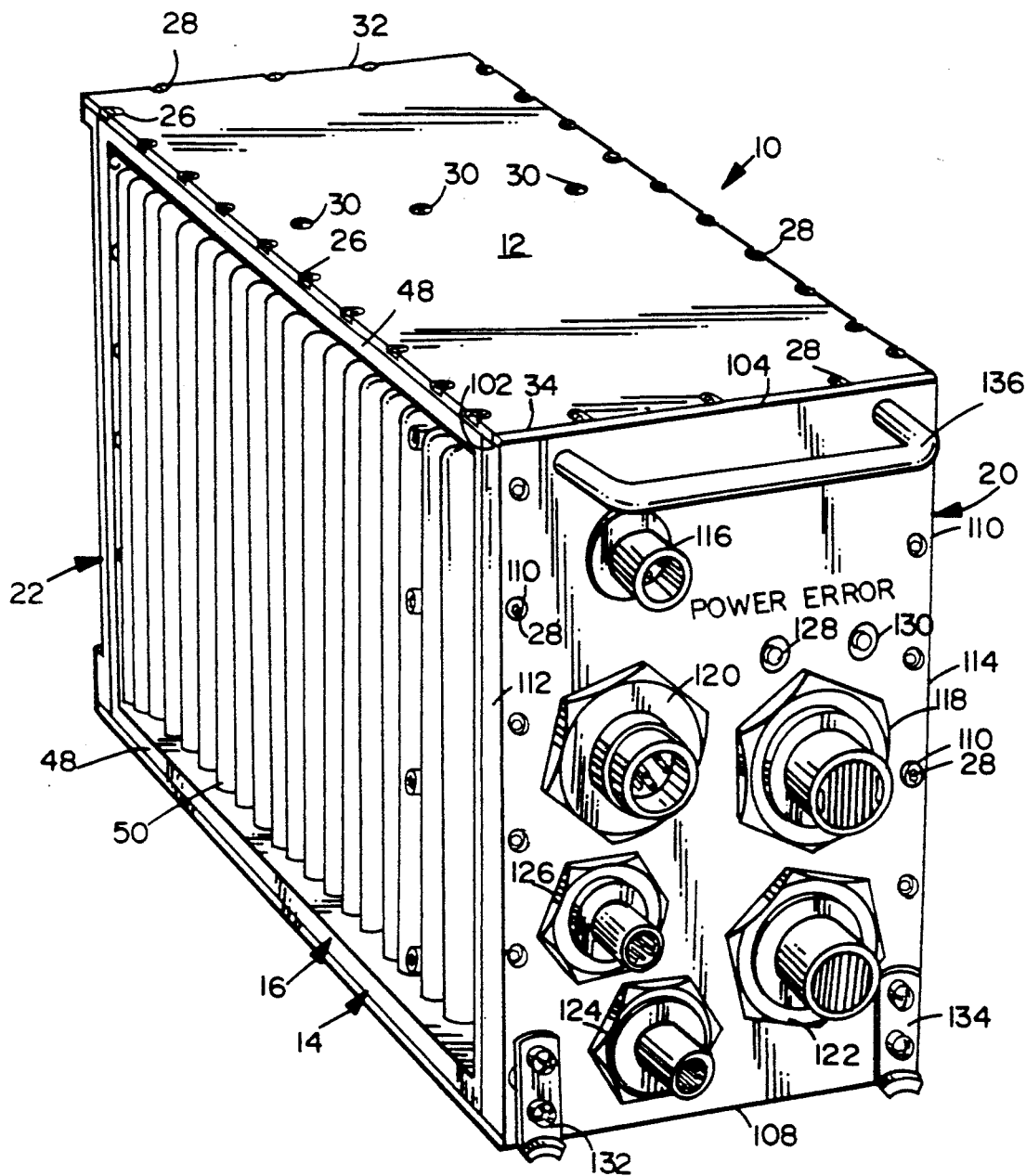
FIG. 1 is a perspective view of a chassis construction in accordance with an exemplary embodiment of the invention.
Figure 7:
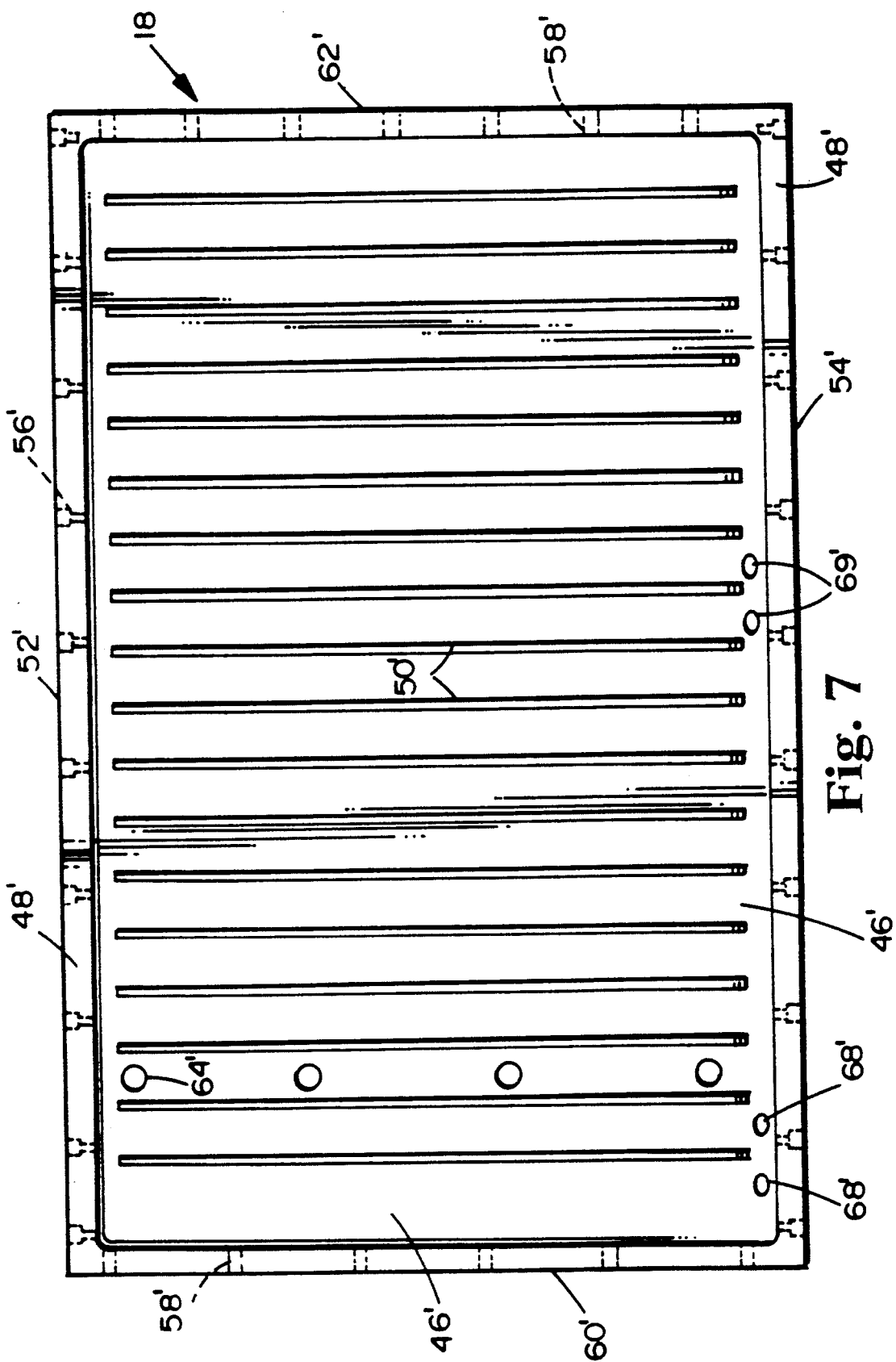
FIG. 7 is a side view of the right side plate of the chassis construction illustrated in FIG. 1.
Figure 8:
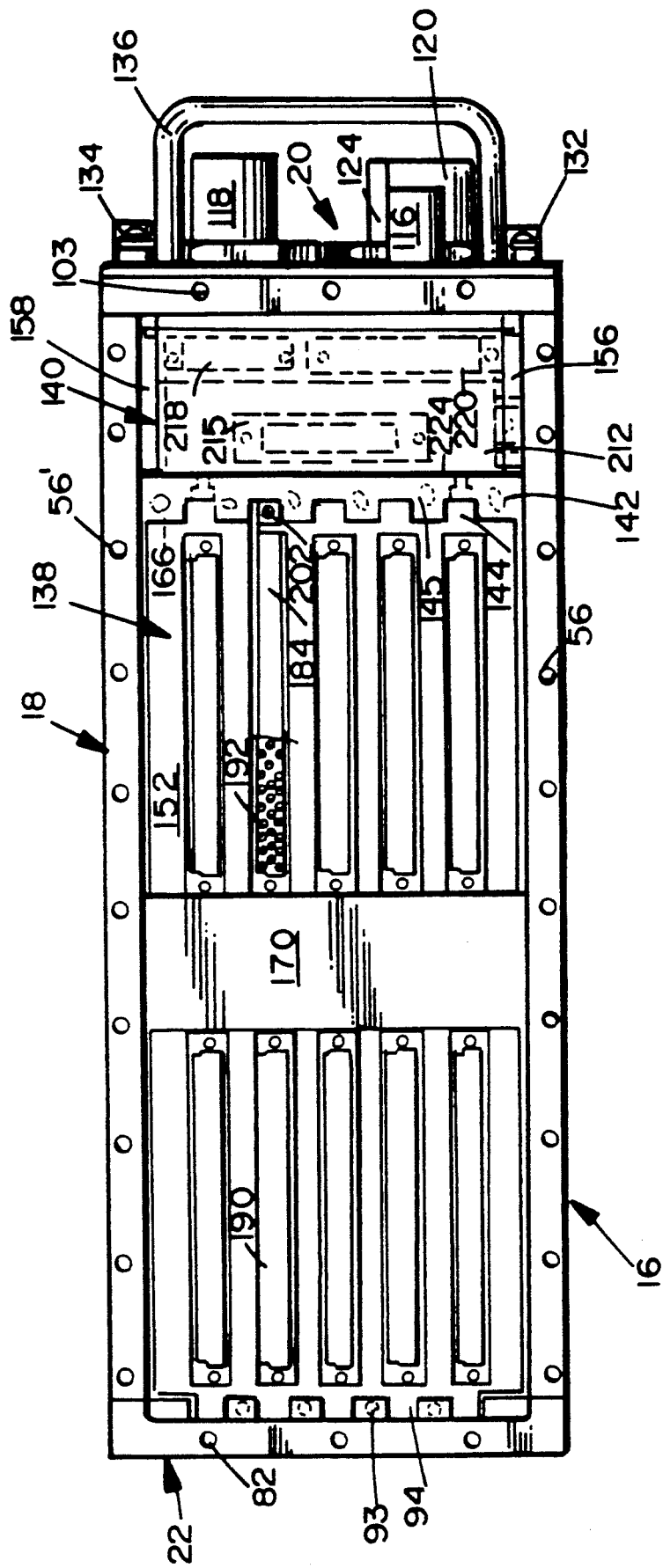
FIG. 8 is a top plan view of the chassis construction illustrated in FIG. 1, with the top cover removed and partially illustrating one circuit card cover installed within the enclosure.

Referring to the drawings, the computer component chassis construction in accordance with an exemplary embodiment of the invention is illustrated at 10 in FIG. 1 and includes a top cover 12, a bottom cover 14 (see FIG. 6), a left side plate 16, a right side plate 18 (see FIGS. 7 and 8), a face plate 20, and an opposite or rear end plate 22 (see FIGS. 3 and 8). These elements are securely fastened together by means of a plurality of screw fasteners which, as described further below, are of the captive type, i.e., they remain with their respective plate or cover upon disassembly in order to minimize the possibility of losing the fasteners during repair or other procedures in the field which would otherwise negatively impact on EMI prevention. In this regard, the number and spacing of the captive fasteners are selected to insure EMI integrity.

The enclosure or chassis 10 as illustrated in FIG. 1, is capable of supporting a five slot J1/J2 VME bus backplane and five associated power circuit cards, in addition to an internal, regulated DC/DC. converter triple output DC power supply (the power supply itself, other than the means by which it is rigidly mounted within the enclosure, does not form part of this invention). In this exemplary embodiment, the chassis itself measures 4.88 inches in width, 12.62 inches in length and 7.62 inches in height. This provides a configurable housing in a compact package (less than 0.3 cubic foot in volume). The chassis, which comprises an aluminum alloy (preferably 6061-T651) and integral card cage, is also light in weight, i.e., 12 pounds (empty). The chassis construction will now be described in detail.

As best seen in FIGS. 1 and 3, the top cover 12 is a flat, rectangular aluminum alloy sheet (preferably 6061-

T6) having a thickness of 0.125 inch. The top cover 12 is provided about its peripheral edges with a plurality of fastener holes 24 (identical to those provided in the bottom cover shown in FIG. 8), counterbored at 26 so that fasteners 28 are at least flush with (if not slightly recessed from) the exterior surface of the cover.

The top cover 12 is also provided with additional counterbored fastener holes 30 (similar to holes 24) aligned transversely of the top cover, i.e., in a line parallel to and intermediate the end edges 32, 34. The purpose of the fastener holes 30 will be described further herein.

The bottom cover 14, best seen in FIGS. 6 and 6A, is essentially identical to the top cover 12 with fastener holes 36, counterbored at 38, provided about the peripheral edges of the cover or plate, and adapted to receive fasteners 28, three of which are shown in FIG., 6A (a detailed view of a fastener 28 is provided in FIG. 14).

Bottom cover 14 is also provided with four additional fastener holes 40 intermediate its end edges 42, 44, the purpose for which will be described further herein.

As best seen in FIGS. 1, 2, 2A and 2B, and 7, A and 7B, the side plates 16, 18 are each formed from a relatively thick aluminum alloy plate (preferably 6061-T651) having a thickness of 0.375 inch. Since side plates 16, 18 are essentially identical, only one need be described in detail. Reference numerals applied to the right side plate 18 illustrated in FIGS. 7, 7A and 7B will thus be identical to those applied to the left side plate 16 illustrated in FIGS. 1, 2, 2A and 2B, but with a "prime" designation added. Side plate 16 is milled to provide a recessed area 46 surrounded by a thickened border area 48 with the recessed area supporting a series of integral, elongated and substantially parallel fins 50 extending substantially from top to bottom of the side plate 16. These fins provide surfaces designed to transfer heat away from the power supply as will be explained in further detail below.

The left side plate 16 is secured along its upper and lower edges 52, 54 to the top cover 12 and bottom cover 14, respectively; by means of a plurality of the fasteners 28, which are threaded through the top plate and into a corresponding number of threaded, blind holes 56 formed in the edges 52, 54 of the side plate. Side plate 16 is also provided with a plurality of threaded, blind holes 58 along end edges 60, 62 for receiving fasteners through the face plate 20 and end plate 22 as described further below.

Side plate 16 is also provided with a plurality of fastener holes (identical to holes 64' in FIG. 7, for side plate 18, but not shown in FIG. 2) for receiving a corresponding number of fasteners 66, the purpose of which will be described below.

Finally, side plate 16 is also provided with a pair of fastener holes in its lower, forward corner, adjacent the face plate 20 (similar to those shown at 68' in FIG. 7), and another pair of fastener holes between the ends 60, 62 (similar to those shown at 69' in FIG. 7), the purpose of which will also be described below.

Figure 3A:
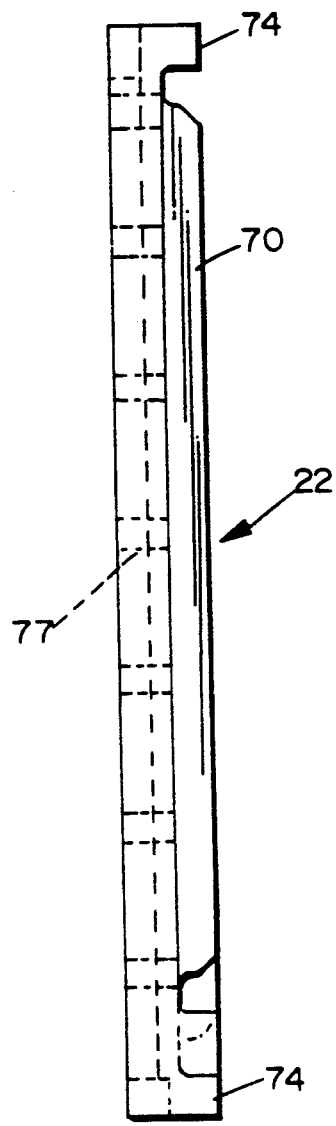
FIG. 3A is a side view of the rear end plate illustrated in FIG. 3.
Figure 3B:
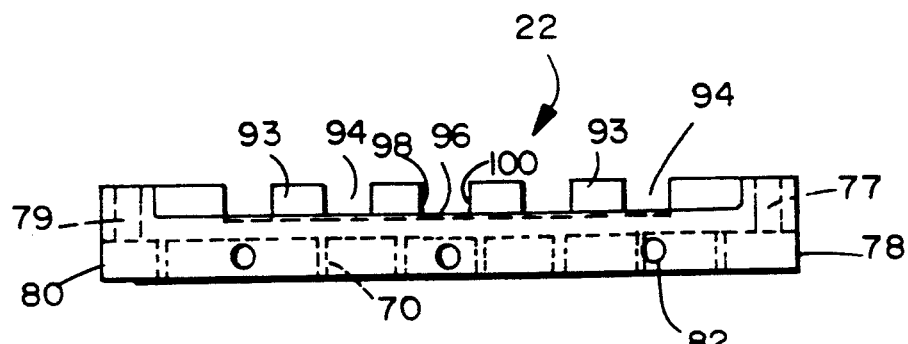
FIG. 3B is a top view of the rear end plate illustrated in FIG. 3 and 3A.

The end plate 22 as best seen in FIGS. 3, 3A and 3B, is also machined from an aluminum plate of the same composition as side plates 16, 18, and having a thickness of 0.625 inch. The exterior of the end plate 22 is machined to provide a plurality of longitudinally extending cooling fins 70 on the exterior surface of the plate which furnish cooling capacity to the circuit cards as will be described below. Fins 70 are located within a recessed area 72, surrounded by the thicker upper and lower borders 74, 76.

The end plate 22 is provided with a plurality of fastener holes 77, 79 extending along its left and right side edges 78, 80, respectively, as well as threaded, blind bores along upper and lower edges 82, 84 (shown in phantom at 86 and 88). By this arrangement, end plate 22 is rigidly secured to side plates 16, 18 by fasteners 28 extending through the end plate into the threaded blind bores 58, 58' in the side plates. At the same time, end plate 22 is rigidly secured to top cover 12 and bottom cover 14 by fasteners 28 threaded through holes 36 (not shown in the top cover 12) in the top and bottom covers 12, 14 and into the threaded blind bores 82, 84 in the end plate 22.

End plate 22 is also provided with a pair of blind bores 90, 92 (each of which is provided with a steel bushing 91, 93) at the lower end thereof which are designed to receive, in a conventional manner, a pair of prongs (not shown) located in the rack in which the enclosure 10 is to be installed to provide stability against lateral movement of the enclosure.

The interior surface of the end plate 22 is milled or machined to provide a plurality (in this case, five) of squared, integral ribs 93 which define a plurality of corresponding grooves 94, best seen in FIGS. 3B and 8, which extend lengthwise of the end plate in substantially parallel arrangement with the exterior cooling fins 70. Each groove has a base surface 96 and a pair of side surfaces 98, 100 and is adapted to receive one edge of one of the power circuit boards (see FIG. 8). The manner in which the grooves and power circuit board edges cooperate to provide a "card cage" with the necessary rigidity in accordance with this invention will be described in further detail below.

Figure 2:
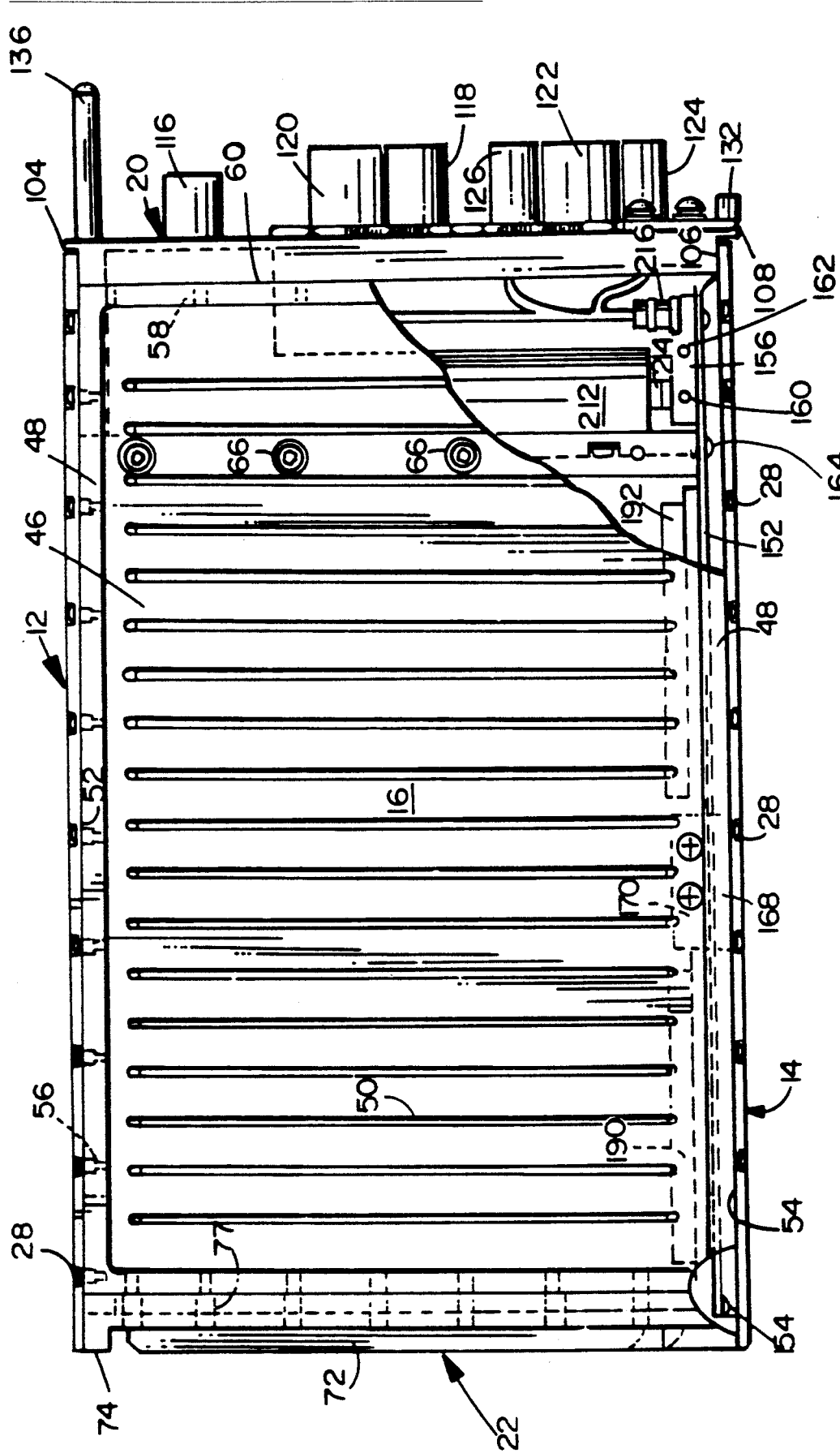
FIG. 2 is a left side view, partially cut away, of the chassis illustrated in FIG. 1.

With reference now principally to FIGS. 1, 2 and 4, the face plate 20 is also formed from an aluminum alloy plate of the same composition and substantially the same thickness as end plate 22. An upper shoulder 102 milled in the upper edge 104 of face plate 20 provides a support surface for the top cover 12. Fastener holes along edge 34 of the top cover 12 align with threaded blind holes 103 provided along shoulder 102 so that the top cover can be rigidly secured thereto by means of fasteners 28.

Similarly, a lower shoulder 106 milled in the lower edge 108 of the face plate provides a support surface for the bottom cover 14. Fastener holes along the forward edge 44 of the bottom cover 14 align with threaded, blind holes (not shown) along shoulder 106 so that the bottom cover can also be rigidly secured to the face plate 20.

The face plate is also provided with a plurality of threaded fastener holes (not specifically shown), counterbored at 110 and aligned along left and right edges 112, 114 of the face plate for receiving fasteners 28 which extend through the face plate, into threaded, blind holes 58, 58' in the left and right side plates 16, 18, respectively.

The face plate 20 is provided with a plurality of connectors that furnish DC power (116) a small computer system interface (118) as well as asynchronous serial and user defined I/O connectors (120, 122, 124 and 126). Indicators 128, 130 are also provided. Since the power supply does not form a part of this invention, no further description of the various connectors on the front face 20 is necessary.

The front face is provided with a pair of L-shaped tabs 132, 134 at its lower end which facilitate anchoring of the unit 10 in its installation site. As noted previously, the apertures 90, 92 on the end plate 22 receive a pair of prongs within the installation cavity to hold the unit 10 in place. At the same time, tabs 132, 134 may be clamped to another support surface to firmly anchor the unit 10 in place. It will be appreciated that merely by unclamping tabs 132, 134, the unit 10 may be pulled out of its installation site for repair, maintenance, etc., and then easily reinstalled following the reverse procedure.

Face plate 20 is also provided with a handle 136 to facilitate transport, installation and removal of the unit.

Figure 9:
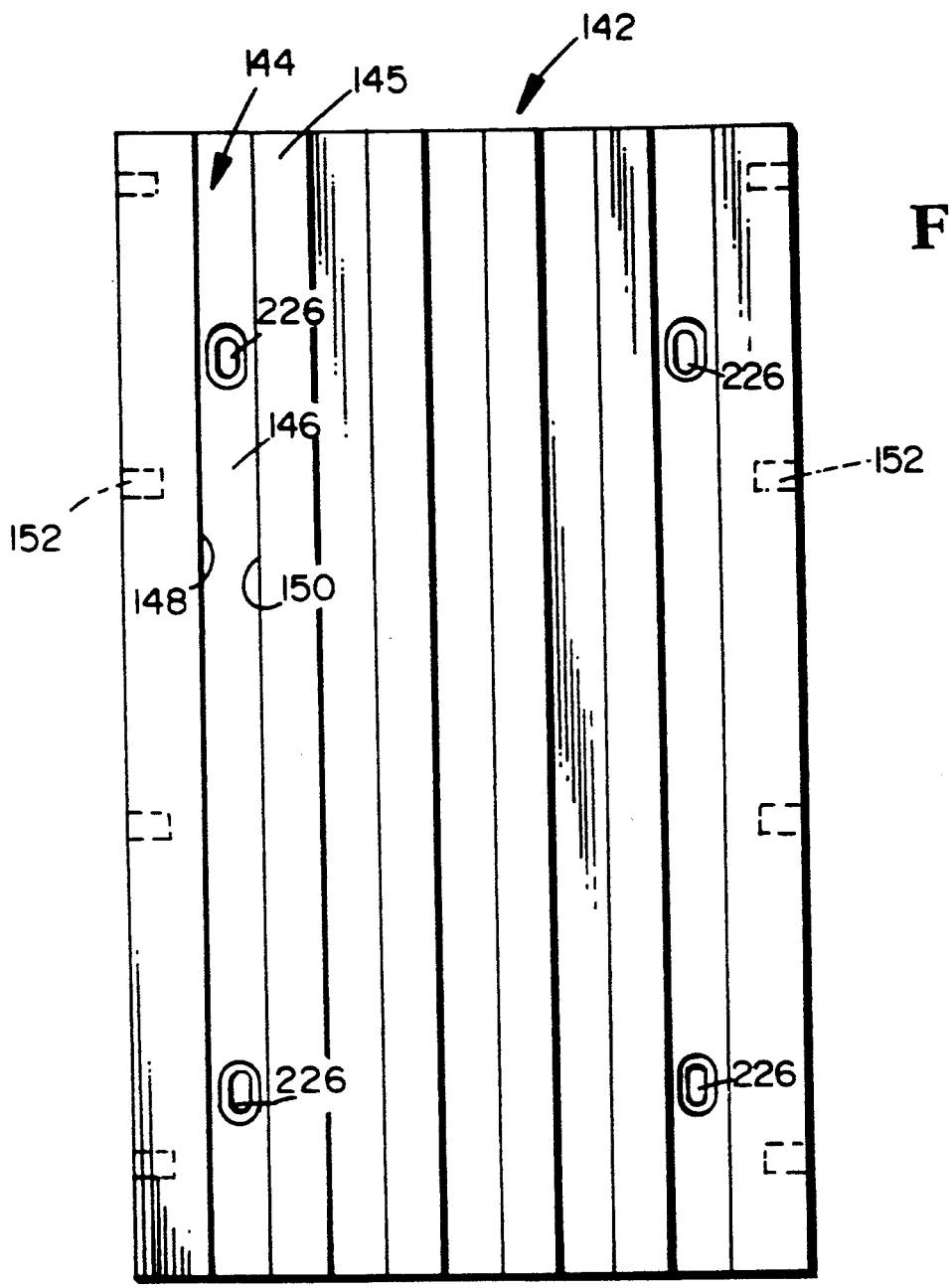
FIG. 9 is a rear end view of an interior partition mounted within the enclosure as seen in FIG. 8.

Referring now to FIGS. 8 and 9, the unit 10 is subdivided into a power circuit card support area 138 and a power supply support area 140. These areas are separated by an interior partition 142 formed from a 0.50 inch aluminum alloy plate (preferably 6061-T651) milled to provide a plurality of longitudinally extending grooves 144 (defined by corresponding ribs 145), each of which has a base surface 146 and a pair of opposed side surfaces 148, 150 (see FIG. 9). As can best seen in FIG. 8, the first series of grooves 94 provided in end plate 22 are in alignment with the grooves 144 provided in the interior partition 142. The partition 142 is fixed between the left and right side plates 16, 18, by the screw fasteners 66, previously described, which extend through the left and right side plates 16, 18 and into a corresponding number of threaded, blind holes 152 provided in the left and right edges of the partition 142. The partition 142 also extends from a backplane 152 (described below) toward the top cover 12, terminating approximately ⅜ inch short of the interior surface of the top cover.

Referring especially to FIGS. 2 and 8, the backplane 152 is a substantially planar member located adjacent the bottom cover 14 of the unit 10, and rigidly secured at one end to the end plate 22 by fasteners 154, (one shown in FIG. 2) extending into blind holes provided in the end plate.

At its forward end (the end closest to the face plate 20), the backplane 152 has rigidly securely thereto, left and right support elements 156, 158 which, as will be explained further below, serve to support the I/O and power supply connectors. These support elements 156, 158, however, also serve to rigidify the forward end of the backplane 152 in that they are rigidly fastened to the left and right side plates 16, 18, respectively. Thus, as can be seen in FIGS. 2 and 8, support element 156 is provided with lateral threaded apertures 160, 162 which are adapted to receive fasteners extending through holes in the left side plate 16 (similar to holes 68' in FIG. 7). A similar arrangement is provided on the right side of the unit with respect to support element 158 and side plate 18.

The backplane 152 is also rigidly secured intermediate its forward and rearward ends. For example, as best seen in FIG. 2, the backplane is rigidly secured to the interior partition 142 by means of a plurality of fasteners 164 which extend into threaded, blind holes 166 (shown in phantom in FIG. 8).

At the center of the card support area 138, the backplane 152 is rigidly sandwiched between a shim 168 (FIG. 10) and a center support bar 170 (FIG. 11). The shim and support bar are rigidly secured to each other through the backplane by means of fasteners extending through counterbored holes 172 in the shim and into threaded blind holes 174 provided in the center support bar 170. At the same time, the center support bar is rigidly secured to the side plate 16, 18 by fasteners 176 extending through the side plates and into threaded blind holes 178 provided in side edges 180, 182 of the center support bar. Shim 168 is also rigidly secured to the bottom cover 14 by fasteners 40 extending through the bottom cover into threaded blind holes 41 provided in the shim. Thus, the backplane 152 is rigidly secured against movement in three mutually perpendicular directions.

Figure 12:
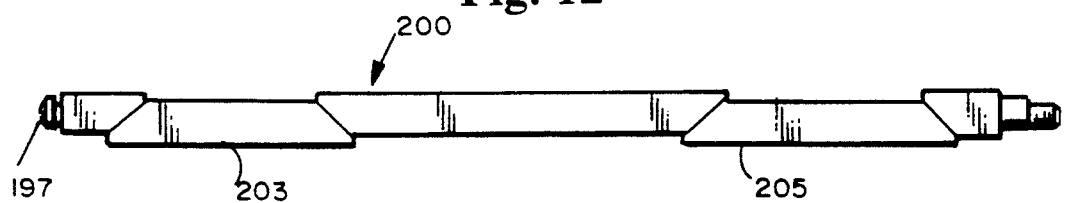
FIG. 12 is a side view of a wedge type locking mechanism utilized to lock the circuit cards in place in accordance with an exemplary embodiment of the invention.
Figure 13:
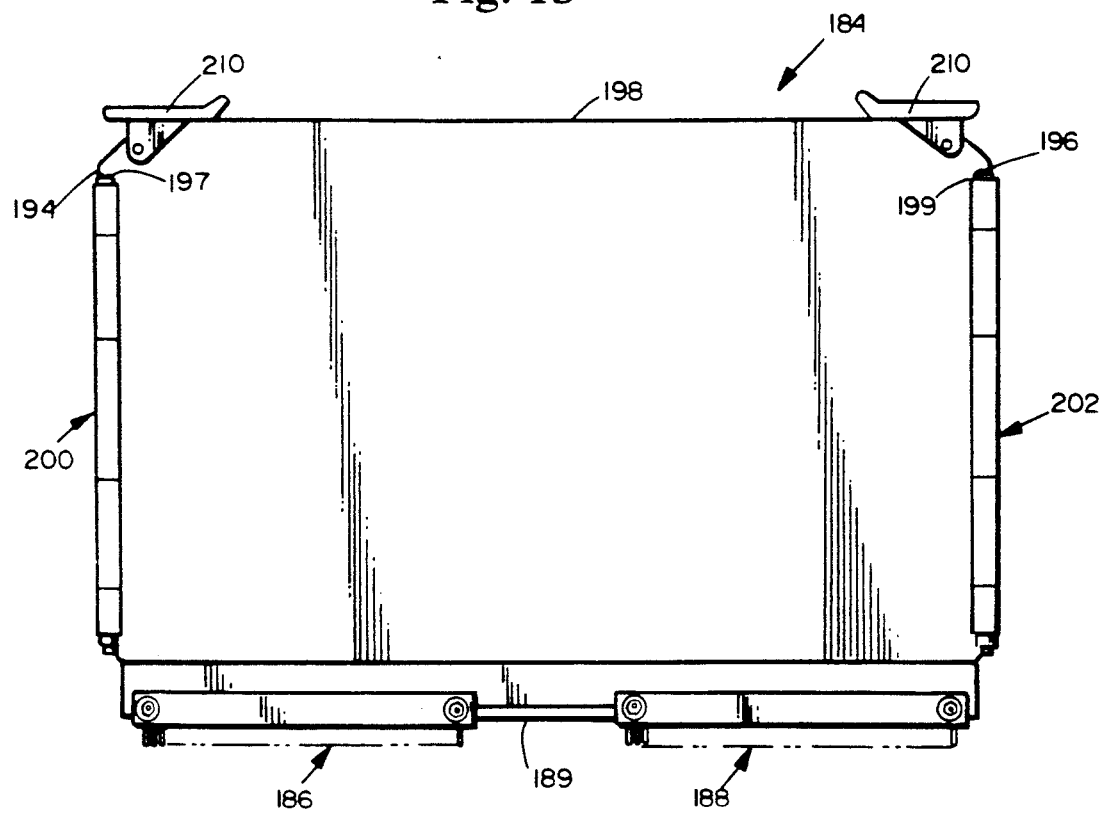
FIG. 13 is a side view of a circuit card for use in the enclosure of this invention.

Referring now especially to FIGS. 8, 12 and 13, five circuit cards 184 may be mounted within the circuit card support area 138 of the enclosure 10 in upright, substantially parallel relationship with pin connectors 186, 188 fixed to the lower or first edge 189 of each card 184 adapted to be received within corresponding socket connectors 190, 192 mounted on the backplane 152. The circuit card 184 as well as connectors 186, 188, 190 and 192 are of conventional pin/socket construction and need not be described in any further detail.

The card 184 has second and third parallel edges 194, 196 and a fourth top edge 198 which extends substantially parallel to the lower or first edge 185. Upon insertion into the enclosure 10, it will be appreciated that each card 184 will be received within the laterally aligned grooves 94, 144 formed in the end plate 22 and interior partition 142, respectively. In order to rigidify the engagement of the second and third edges 194, 196 of each card 184 within respective grooves 94, 144, identical locking bar assemblies 200, 202 are fixedly secured along respective side edges 194, 196 of the card in parallel relationship thereto as best seen in FIG. 13. These locking bars, which may be of the type identified previously, will, upon tightening of elongated screws 197, 199 extending therethrough, cause associated wedge elements 203, 205 to expand outwardly against one of the side surfaces 98, e.g., 148 etc. of the respective grooves 94, 144 to thereby rigidly secure the second and third edges 194, 196 of the cards 184 within the respective grooves. One such arrangement is partially shown in FIG. 8, the remaining cards having been deleted from the figure for purposes of clarity.

Figure 5:
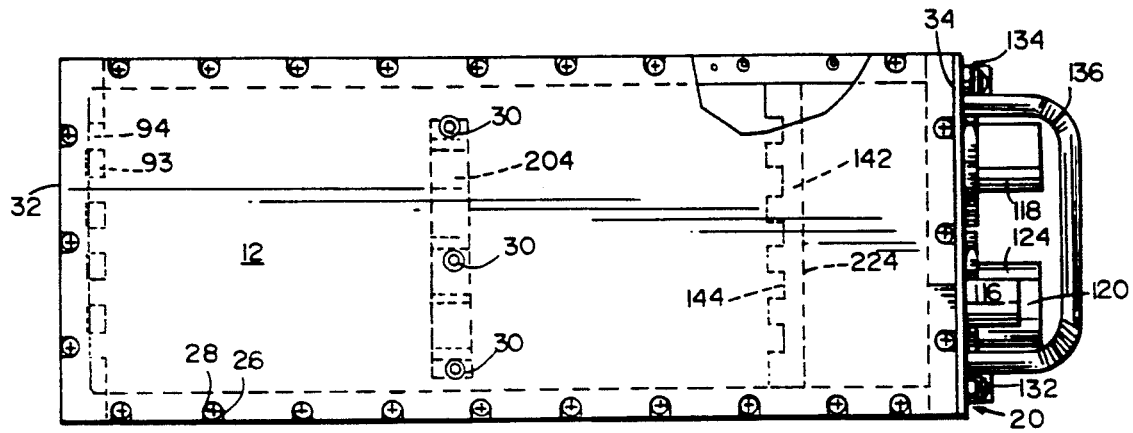
FIG. 5 is a top plan view of the chassis construction illustrated in FIG. 1.
Figure 5A:
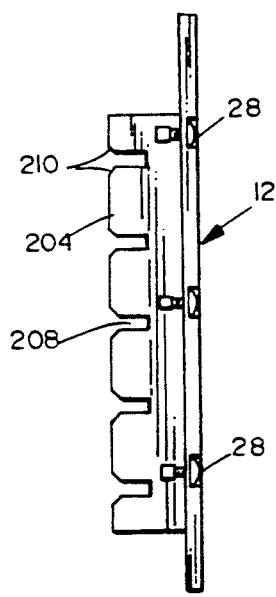
FIG. 5A is an end view of the top cover of the chassis construction illustrated in FIG. 1.

In order to prevent flexing of the cards, particularly in their upper portions along the fourth edges 198, a block in the form of a car comb 204, best seen in FIG. 5 and 5A is rigidly secured to the underside of the top cover 12, by means of fasteners 30 extending from the top cover into threaded blind holes (not shown) provided in the comb 204. The comb 204 is provided with a plurality (five in the preferred embodiment) of narrow slots 208 having chamfered entry surfaces 210 which are sized and aligned to receive the upper edges 198 of the cards 184 intermediate the second and third edges of the cards. Upon assembly of the top cover 12, the card comb 204 is under a slight compressive force vis-a-vis the top cover 12 and the upper edges 198 of the cards so as to maintain the latter rigidly and immovably secured within the enclosure 10. Conventional ejector ears 210 are fitted to cards 194 to facilitate removal from the enclosure 10.

Turning again to FIG. 2, the power supply 212 has a lower main connector 214 which plugs into a corresponding connector 215 (see FIG. 8) provided on the backplane 152, and includes additional cable connectors 216 which may be received within connectors 218, 220 on the backplane 152. The power supply 212 is rigidly secured to the substantially flat surface 224 of the interior partition 142 by means of fasteners extending through four apertures 226 provided in the interior partition and as best seen in FIG. 9. By this arrangement, the power supply 212 is also securely and rigidly mounted within the enclosure 10.

It will be appreciated that by reason of the engagement of the circuit cards 184 within the grooves 94 formed on the end plate 22, end plate 22 serves as a heat sink for the circuit cards 184 thus providing cooling capacity via fins 70 to the cards 184 and eliminating the need for active cooling. At the same time, the heat conducting engagement between the power supply and the interior partition 142 which, in turn, is secured in heat conducting relationship with the side plates 16, 18, provides cooling for the power supply via fins 50, 50'.

The above described construction is sufficiently rigid ter shank portion 228 corresponds precisely to the thickness of the first plate 232, the fastener 28 will remain captive within the first plate unless a conscious effort is made to also thread the fastener 28 back out of the threaded aperture 234 of the first plate. This arrangement provides a effective means for eliminating or at least minimizing the potential for lost fasteners during field operations to maintain and/or repair the unit. As a result, EMI integrity is assured.

As a result of the above described construction, a versatile, low cost, compact, lightweight, five-slot VME bus system chassis construction is provided which requires no external cooling or isolation. At the same time, the chassis meets strict environment specifications as follows:

| ENVIRONMENTAL SPECIFICATIONS | |
| --- | --- |
| Temperature | MIL-STD-810C, Method 501.1, Proc. II |
| (ambient air) | MIL-STD-810C, Method 502.1, Proc I |
| Operational | −22° F. to 131° F. |
| Non-Operational | −70° F. to 160° F. |
| Altitude | MIL-STD-810C, Method 504.1, Proc. I, Table 504.1, Cat 4, to MIL-E-5400T, |
| Class 1A | |
| Operational | −65° F. & 300,000 ft; 147° F. & 20,000 ft. |
| Non-Opertional | −80° F. to 185° F. |
| Humidity | MIL-STD-810C, Method 507.1, Proc. I |
| Operational | 86° F. & 85% RH |
| Non-Operational | 149° F. & 95% RH |
| Vibration | MIL-STD-810C, Methods 514.2, Proc. VIII, Cat F, Curve W (4.2 Gs r.m.s.), Sinusoidal Cycling |
| | MIL-STD-810D, Method 514.3, Proc. I, Cat 10 (7.6 Gs r.m.s.), Random |
| | MIL-STD-810D, Method 514.3, Proc. I, Cat (4.2 Gs r.m.s.), Random |
| Shock | MIL-STD-810C, Method 516.2, Proc. I, FIG. 516.2-2, operating 30 Gs, 11mSec |
| | MIL-STD-810C, Method 516.2, Proc. V, Non-Operating bench handling |
| | MIL-E-5400T, Paragraph 3.2.24.6, 30 Gs; 11mSec |
| Sand/Dust | MIL-STD-810C, Method 510.1, Proc. I options D & F, to reqs of MIL-E-5400T. Class 1A (44 μm to 150 μm) |
| Fungus | Per MIL-STD-810D, Method 508.3 | and strong as to eliminate the need for external isolation/damping arrangements for the enclosure 10. In other words, the enclosure can be "hard mounted" where desired while still meeting environmental specifications as noted below.

EMI protection is provided for the enclosure 10 by plating all surfaces of the side plates and end plates with a multi-layer metal coating consisting of copper, nickel and tin, in that order, each layer being approximately 0.0002 to 0.0005 inch in thickness. The above described multi-layer coating effectively serves as a "gasket" between the mating surfaces of the enclosure components so that when all of the fasteners have been tightened to specifications, effective EMI protection is provided.

With regard to the numerous captive fasteners 28 employed to secure the various components of the enclosure 10 together, reference is made to FIG. 14 which illustrates one such specific captive fastener. As can be seen in the FIG., each fastener 28 includes a head 226, a relatively small diameter shank portion 228, and a larger diameter threaded portion 230. One of the plates 232 to be fastened, has a threaded aperture 234, counterbored at 236 through which the fastener 28 must be threaded to have access to the second plate 238. The second plate 238 is provided with a threaded blind hole 240. In order to fasten the two plates together, the fastener 28 must first be threaded through the first plate 232, and then threaded into the blind bore 240 of the second plate 238. It will be appreciated that upon disassembly, the fastener 28 will first be backed away from the second plate 238 resulting in the first and second plates separating. Since the length of the smaller diame- In addition, the chassis construction in accordance with this invention has been further qualified in accordance with electromagnetic specifications. The Pulse ECS, Inc. 7000® 1/2 ATR Chassis disclosed herein has been qualified in accordance with MIL-STD-461A, Class A1b equipment for CE01, CE03, CE04, CS02, CS06, RE02, and RS03.

It will be appreciated by those of ordinary skill in the art that the presently described chassis construction not only has military but also aerospace, industrial, geotechnical and other applications.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A chassis construction incorporating a plurality of circuit cards and a power supply comprising:
   a top cover, bottom cover, a pair of side plates and a pair of end plates secured together to form an airtight seal along all abutting edges;
   a backplane rigidly fixed to one of said top and bottom covers, and rigidly fixed to said pair of side plates and one of said pair of end plates, said backplane mounting a plurality of connectors for electrical connection with mating connectors along a first edge of each of said plurality of circuit cards;

an internal partition separating said plurality of circuit cards from said power supply, said internal partition rigidly connected to said pair of side plates; and wherein said backplane is rigidly connected to said internal partition between opposite ends of said backplane; and a plurality of mounting grooves in one of said end plates, said internal partition, and in a card comb rigidly attached to said top cover, intermediate said one of said end plates and said interior partition, for receiving respective second, third and fourth edges of each of said plurality of circuit cards.

2. The chassis construction according to claim 1 wherein locking mechanisms are provided along said second and third edges of each of said plurality of circuit cards for locking said plurality of circuit cards in said mounting grooves receiving said second and third edges.

3. The chassis construction according to claim 1 wherein said mounting grooves for receiving one of said second and third edges are integrally formed in one of said end plates.

4. The chassis construction according to claim 3 wherein said mounting grooves for receiving the other of said second and third pages are integrally formed in said internal partition.

5. The chassis construction according to claim 1 wherein said backplane is reinforced in a direction transverse to said first edge of said plurality of circuit cards.

6. The chassis construction according to claim 1 wherein at least said pair of side plates are provided with a plurality of exterior cooling fins.

7. A chassis construction incorporating a plurality of circuit cards and a power supply comprising:

a top cover, bottom cover, a pair of side plates and a pair of end plates secured together to form an airtight seal along all abutting edges;

a backplane fixed to one of said top and bottom covers, said backplane mounting a plurality of connectors for electrical connection with mating connectors along a first edge of each of said plurality of circuit cards;

mounting grooves for receiving second, third and fourth edges of each of said plurality of circuit cards; and an internal partition separating said plurality of circuit cards from said power supply;

wherein at least said pair of said plates are provided with a plurality of exterior cooling fins; and wherein said internal partition is rigidly fastened to said power supply and said pair of side plates to thereby provide a heat sink for said power supply.

8. The chassis construction of claim 7 wherein one of said end plates is provided with a plurality of cooling fins to provide a heat sink for said plurality of circuit cards.

9. The chassis construction of claim 8 wherein said one of said end plates is located remote from said power supply.

10. The chassis construction of claim 9 wherein the other of said end plates comprises a face plate for said power supply, and is provided with a plurality of connector ports.

11. The chassis construction of claim 1 wherein surfaces of said pair of side plates and pair of end plates are metal and are coated directly with layers of copper, nickel and tin.

12. The chassis construction of claim 11 wherein said top cover, bottom cover, side plates and end plates are constructed of an aluminum alloy.

13. The chassis construction of claim 12 wherein said internal partition is constructed of an aluminum alloy.

14. The chassis construction of claim 12 wherein each of said copper, nickel and tin layers are between about 0.0002 and 0.0005 inch.

15. The chassis construction of claim 14 wherein said copper layer is adjacent said aluminum and said nickel layer is sandwiched between said copper and tin layers.

16. The chassis construction of claim 1 wherein said backplane comprises a five slot, monolithic VME bus backplane.

17. The chassis construction of claim 1 wherein said top cover, bottom cover, side plates and end plates are constructed of a 6061 aluminum alloy.

18. A severe environment enclosure comprising:

a first area supporting a plurality of computer components;

a second area separated from said first area by an internal partition, said internal partition at least partially supporting a power supply;

first means including said internal partition for rigidly mounting said plurality of computer components in three orthogonal directions within said first area; and integral heat transfer means including said internal partition for carrying heat form said power supply out of said enclosure.

19. The enclosure of claim 18 and including a multilayer metal plating applied directly to substantially all surfaces of the enclosure for enhancing EMI protection.

20. The enclosure of claim 18 wherein said plurality of computer components includes a backplane and a plurality of power circuit cards electrically connected along first edges to said backplane.

21. The enclosure of claim 20 wherein said first means includes elongated grooves for receiving second and third substantially parallel edges of each of said plurality of power circuit cards, and wedge means along each of said second and third edges for locking said plurality of power circuit cards within said grooves.

22. The enclosure of claim 21 wherein said plurality of power circuit cards are substantially parallel and said first means also includes a card edge comb extending across fourth edges of said plurality of power circuit cards, said fourth edges extending substantially parallel to said first edges.

23. The enclosure of claim 22 wherein said card edge comb is rigidly fastened to a top cover of said enclosure.

24. The enclosure of claim 20 wherein said integral heat transfer means includes a plurality of cooling fins on at least one exterior surface of said enclosure, said cooling fins being in heat conducting relationship with said internal partitions.

25. The enclosure of claim 21 wherein said elongated grooves for receiving one of said second and third edges are formed on one side internal partition, and wherein said power supply is in heat conducting engagement with an opposite side of said internal partition.

26. The enclosure of claim 19 wherein said multilayer metal plating includes layers of copper, nickel and tin.

27. A severe environment enclosure for computer components and an associated power supply, said enclosure including metal top and bottom covers, a pair of metal side plates and a pair of metal end plates, said enclosure having a multi-layer metal plating directly applied at least to all mating surfaces of said top and bottom covers, side plates and end plates, and wherein each edge of each of said top and bottom covers, said pair of side plates and said pair of end plates is formed with a plurality of fastener holes receiving fasteners therein, such that upon tightening all of said fasteners, said multi-layer plating provides means for enhancing EMI protection.

28. The enclosure of claim 27 wherein said top cover, bottom cover, side plates and end plates are constructed of an aluminum alloy.

29. The enclosure of claim 28 wherein said multi-layer metal plating includes layers of copper, nickel and tin, and wherein each of said layers are between about 0.0002 and 0.0005 inch in thickness.

30. The enclosure of claim 29 wherein said copper layer is adjacent said aluminum alloy, and said nickel layer is sandwiched between said copper and tin layers.

31. The enclosure of claim 27 and further comprising a power supply, wherein an interior partition extends between said pair of side plates to form a component support area and a power supply support area, said partition partially supporting both said computer components and said power supply.

32. The enclosure of claim 31 wherein said interior partition serves as a heat sink for said power supply.

33. The enclosure of claim 31 and further comprising a backplane rigidly secured to at least one of said end plates, both of said side plates, said bottom cover and interior partition.

34. A severe environment enclosure for computer components and an associated power supply, said enclosure comprising top and bottom covers, a pair of side plates and a pair of end plates; an interior partition extending between said pair of side plates to form a component support area and a power supply support area; a plurality of computer components mounted within said component support area and a power supply mounted within said power supply area; said partition partially supporting both said computer components and said power supply; and a backplane extending between said pair of end plates in said component support area and said power supply support area, said backplane rigidly fastened to at least one of said end plates, both of said pair of side plates, said bottom cover and said interior partition.

35. The enclosure of claim 34 wherein said backplane includes an upper surface and a lower surface, and wherein means are provided on said upper surface and said lower surface secured together through said backplane, and secured to said bottom cover and said side plates for rigidifying said backplane.

36. The enclosure of claim 35 wherein said means are located between said end plates of the enclosure.

* * * * *